US 6,664,783 B1

(12) United States Patent
Baril et al.

(10) Patent No.: US 6,664,783 B1
(45) Date of Patent: Dec. 16, 2003

(54) SYSTEM FOR MEASURING MAGNETOSTRICTION EMPLOYING A PLURALITY OF EXTERNAL MAGNETIC FIELD ROTATION HARMONICS

(75) Inventors: Lydia Baril, Sunnyvale, CA (US); Kenneth Donald Mackay, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/197,313

(22) Filed: Jul. 15, 2002

(51) Int. Cl.$^7$ .................. G01R 33/12; G01R 33/18; G01B 7/24
(52) U.S. Cl. .................. 324/209; 324/228; 324/232
(58) Field of Search .................. 324/209, 228, 324/232, 235

(56) References Cited

U.S. PATENT DOCUMENTS 4,310,798 A     1/1982   Brunsch et al. ............. 324/209

OTHER PUBLICATIONS

*IBM Technical Disclosure Bulletin*, Jul. 1988, pp. 59–60, "Device to Measure Magnetostriction of Thin Film on a Substrate".
*IEEE Trans. Magn.*, vol. 25/No. 3, May 1989, pp. 2629–2638, "A New High–Precision Optical Technique to Measure Magnetostriction of a Thin Magnetic Film Deposited on a Substrate".
*IEEE Trans. Magn.*, vol. 25/No. 5, Sep. 1989, pp. 4201–4203, "Measurement of Thin Film's Magnetostriction with Piezoelectric Cermic Substrates".
*IEEE Trans. Magn.*, vol. 29/No. 6, Nov. 1993, pp. 2989–2991, "Magnetostriction Measurement by Interferometry".
*IEEE Trans. Magn.*, vol. 31/No. 6, Nov. 1995, pp. 3391–3393, "Measurement of Very Low Magnetostrictions in Thin Films".

Primary Examiner—Gerard R. Strecker
(74) Attorney, Agent, or Firm—Ervin F. Johnston

(57) ABSTRACT

A system for measuring the magnetostriction coefficient $\lambda$ of a sample material applied to a substrate element fixed at one end leaving the other end free to be deflected. An external rotating magnetic field of rotation frequency f and intensity $H_{ext}$ is applied to the cantilever substrate element the amplitude $A_m$ of the deflection of the free end is measured at each of a plurality of rotation frequency harmonics $\{f_m\}$ by, for example, using a plurality of lock-in amplifiers. The harmonic deflection amplitudes $\{A_m\}$ are combined to determine the magnetostriction coefficient $\lambda$ of the sample material. At an $H_{ext}$ equal to the sample saturation moment $M_{sat}$ and assuming a 15 Oe sample anisotropy $H_k$ and coupling bias $H_p$, the error in the saturation magnetostriction coefficient $\lambda_S$ measured according to this invention may be reduced by 80% to 90% over the error seen when using only the second harmonic deflection amplitudes $A_2$.

26 Claims, 5 Drawing Sheets

«SYSTEM FOR MEASURING MAGNETOSTRICTION EMPLOYING A PLURALITY OF EXTERNAL MAGNETIC FIELD ROTATION HARMONICS

BACKGROUND OF THE INVENTION

1. Field of the Invention

This invention relates generally to systems for measuring magnetostriction in thin magnetic films and more particularly to such a system employing multiple harmonics of an external rotating magnetic field to improve measurement accuracy.

2. Description of the Related Art

Areal data storage densities are increasing at an unprecedented rate owing to advances in the development of magnetic medium and read head materials. Exploiting increasing storage density requires increased signal output from the read sensor. For this reason, thin film inductive read heads were eventually replaced by read heads using the anisotropic magnetoresistance (AMR) effect. Subsequently, a class of metallic multilayer films exhibiting the giant magnetoresistive (GMR) effect were introduced as read heads for hard-disk (HD) and tape magnetic storage devices. GMR effect read sensors exhibit an MR ratio, $\Delta R/R$, that is typically 8% or higher compared with perhaps 2% for earlier AMR sensors. The increased sensitivity allows acceptable signal levels from smaller read element track widths, thereby increasing track density and areal storage density.

The exchange biased spin-valve (SV) is a multilayer GMR device that is most useful for read head applications. A SV consists of several layers: a free and pinned layer both made of a soft ferromagnetic (FM) material such as Permalloy (NiFe) or a cobalt (Co) alloy. These two FM layers are separated by a non-magnetic conductive spacer layer such as copper (Cu). An exchange layer of antiferromagnetic (AFM) material, commonly made of a manganese (Mn) alloy such as NiMn, is deposited next to the FM pinned layer. The FM free layer is thin enough to allow conduction electrons to frequently move back and forth between the free and pinned layers via the conducting spacer layer. The magnetic moment of the FM pinned layer is fixed and held in place by the AFM layer, while the FM free layer magnetic moment changes in response to the external magnetic field, such as that from a bit stored on a hard disk.

The quantum spin property of electrons, i.e., either spin up or spin down, is exploited in SV sensors. Conduction electrons with spin parallel to the FM material's magnetization (spin "up") move freely, while the motion of those electrons with anti-parallel orientation (spin "down") is impeded via collisions with atoms in the material. When the FM free and pinned layer magnetic moments are parallel, spin up electrons move freely in both FM layers, corresponding to a relatively low effective resistance. Conversely, when the free and pinned layer magnetic moments are anti-parallel, movement of spin up electrons is hampered by one layer, while the movement of spin down electrons is hampered by the other, so that neither move freely through both FM layers, leading to a relatively high effective resistance. In the GMR sensor, the external field from a recorded bit rotates the FM free layer magnetic moment relative to that of the FM pinned layer, effectively switching the SV device between the high and low resistance states.

Much of the cost in manufacturing read head sensors is incurred in processing the individual sensors after the actual material deposition process. So a means for qualifying the post deposition product is critical to reduced cost (improved yield). In fabricating GMR SV devices, a variety of in-process metrology is required to provide requisite material deposition process control. In-process measurement of magnetic and magnetoresistive properties is one method by which the film deposition process is qualified and controlled. One exemplary concern is the uniformity and thickness of the deposited layers (the copper spacer layer is typically less than 15 atoms thick). Another is surface roughness, which affects the coupling between layers, the coercivity of the FM free layer, and the effectiveness of the AFM layer in pinning the FM pinned layers. Other concerns include the thin-film properties that significantly affect device performance, such as magnetoresistance, resistivity and magnetostriction. Many of these parameters interact with one another, so fabricating acceptable read sensors requires strict quality control tolerances and processes.

The saturation magnetostriction in the magnetically soft GMR films may induce undesirable magnetic anisotropy changes during head fabrication and therefore must be tightly controlled. Anisotropy is controlled during wafer production using a complex combination of process parameters during magnetic film deposition. Eventually, the wafers are diced and the critical aerodynamic surfaces are polished. Both of these mechanical processes create unpredictable changes in the stress level between the substrate and the magnetic films. The magnetostriction of the film material translates these unpredictable stress changes into changes in the anisotropy of the magnetic layer. Also, an inverse relationship between applied magnetostrictive stress and the MR sensitivity ratio, $\Delta R/R$, has been noted. The preferred way to control anisotropy after deposition is to keep magnetostriction below $10^{-7}$. Accordingly, the accurate measurement and analysis of thin-film magnetostriction is critical to effective process control during manufacture of modern GMR SV sensors.

Determination of the magnetostriction coefficient of ferromagnetic materials by inference from the measurement of the deflection in an external magnetic field $H_{ext}$ of a substrate element on which a layer of the material under test has been applied has been known in the art for several decades. As understood in the 1960's and 1970's, this procedure suffered from numerous well-known disadvantages, including the difficulties of accurate characterization of substrate material parameters, accurate detection of microscopic deflections, heating effects from the requisite external field intensity, unsuitability of the requisite procedures to automation, and the like.

A major improvement in this technique was disclosed in the commonly-assigned U.S. Pat. No. 4,310,798 issued to Brunsch et al. and entirely incorporated herein by this reference. The Brunsch et al. invention optically measures the dynamic displacement of the free end of a cantilever substrate element on which is applied a layer as thin as 5 nm of the FM material under test, in the presence of an external rotating magnetic field. The substrate element deflection arising from magnetostriction of the test material in the external rotating magnetic field occurs at twice the rotation frequency f so this rotation frequency f is tuned to half of the mechanical resonant frequency $f_0$ of the cantilever element to permit accurate detection of the deflection amplitude, which is otherwise too small. Because Brunsch et al. assume the test material to have a linear magnetization characteristic, leading to a quadratic dependence of magnetostriction $\lambda$ on external field intensity $H_{ext}$, their procedure looks for a maximum resonant deflection RMS amplitude $A_0$ and presumes it to be proportional to the saturated magnetostriction $\lambda_S$. The exact proportionality is a function of substrate material characteristics. The Brunsch et al. procedure resolved several problems known in the art and, for the first time, permitted automated magnetostriction testing, but did not eliminate the need for accurate characterization of the substrate material parameters.

Later, Cheng et al. (Cheng et al., "Device to Measure Magnetostriction of Thin Film on a Substrate", *IBM Technical Disclosure Bulletin*, July 1988, pp. 59–60) propose an improvement of the Brunsch et al. procedure that adds a lock-in amplifier to the deflection amplitude sensor that permits operation well below mechanical resonant frequency $f_0$, thereby distinguishing the magnetostrictive deflection $A_2$ at 2f from many other sources of resonant deflection at $f_0$. The lock-in amplifier provided enhanced sensitivity needed to accurately detect the microscopic deflection amplitudes below mechanical resonance.

The Cheng et al. proposal was later improved by Tam et al. (Tam et al., A New High-Precision Optical Technique to Measure Magnetostriction of a Thin Magnetic Film Deposited on a Substrate, *IEEE Trans. Magn.*, vol. 25, no. 3, pp. 2629–38, May 1989) by adding a piezoelectric actuator for in situ calibration of the substrate element contributions to the measured deflection $A_2$ at 2f for removal from the magnetostrictive deflection measurements. By exciting the detector with a separate piezoelectric actuator at rotation frequency f and measuring the resulting $H_{ext}=0$ deflections $\{A_2\}$ before and after measuring the deflection $A_2$ in a nonzero rotating external magnetic field intensity $H_{ext}$, the unwanted effects on the reflected signal of substrate material reflectivity and curvature may be eliminated from the magnetostrictive measurements. As with Cheng et al., all deflection measurements $\{A_2\}$ are made well below mechanical resonant frequency $f_0$ and a lock-in amplifier is used to measure the RMS deflection $A_2$ at the second rotation harmonic frequency 2f, which is presumed to be proportional to the magnetostriction coefficient $\lambda$.

At about the same time, Arai et al. (Arai et al., "Measurement of Thin Film's Magnetostriction with Piezoelectric Ceramic Substrates," *IEEE Trans. Magn.*, vol. 25, no. 5, pp. 4201–3, September 1989) made a similar proposal to improve the art by using a piezoelectric substrate and measuring the piezoelectric drive voltage required to exactly cancel the magnetostrictive strain-induced deflection $A_2$ of the free end of a cantilever substrate element at the second rotation harmonic 2f. But accurate knowledge of the substrate piezoelectric constant $d_{31}$ is necessary to determine the desired magnetostriction coefficient $\lambda$ using the Arai et al. technique, which does not eliminate the many other disadvantages of the original cantilever deflection second-harmonic amplitude method.

Later, Bellesis et al. (Bellesis et al., "Magnetostriction Measurement by Interferometry," *IEEE Trans. Magn.*, vol. 29, no. 6, pp. 2989–91, November 1993) introduced Doppler interferometry to the cantilever deflection measurement process, thereby improving deflection measurement precision to about 0.01 nm. Using a smaller sample size, higher rotation frequencies may be used to avoid many common spurious vibrations. Bellesis et al. note that the deflection amplitudes $\{A_m\}$ at rotation harmonics $\{f_m\}$ other than the deflection $A_2$ at the second harmonic $f_2$ may be observed with their technique (assuming that none are close to mechanical resonance $f_0$) and they speculate as to the source and significance of the various harmonics, but neither consider nor suggest using the other rotation frequency harmonics $\{f_m\}$ to implement an improved automated magnetostrictive measurement process.

Similarly, Rengarajan et al. (Rengarajan et al. "Measurement of Very Low Magnetostrictions in Thin Films," *IEEE Trans. Magn.*, vol. 31, no. 6, pp. 3391–3, November 1995) proposes using a highly-sensitive interferometer with in situ calibration, thereby improving deflection measurement precision by an order of magnitude over Bellesis et al. (to about 1.0 pm). Rengarajan et al. suggest using close-coupled copper strips instead of Helmholtz coils to permit even smaller substrate element sizes and higher rotation frequencies than those proposed by Rengarajan et al., thereby removing even more spurious vibrations from the measurements.

For several years, the commercial instruments available for measuring magnetostriction in thin films have included the LaFouda LAMBDA09 Automated Magnetostriction Tester (available from LaFouda Solutions, San Diego, Calif.), which automates the Tam et al. sub-resonant rotating-field second-harmonic cantilever displacement amplitude technique discussed above. Even in view of the dramatic increases in precision made possible by Bellesis et al. and Rengarajan et al., this technique still suffers from several well-known disadvantages that affect accuracy. The procedure relies on several assumptions that are increasingly problematic. Until the advent of the most recent GMR sensor designs, these accuracy problems were commercially tolerable.

For example, the rotating field frequency is selected to cause the substrate element cantilever to oscillate at twice the field rotation frequency f and the magnetostriction coefficient $\lambda$ is derived from the measured second-harmonic deflection amplitude $A_2$. This approach relies on a simple quadratic relationship between magnetostrictive strain and applied magnetic field intensity, which in turn assumes a linear magnetization curve in the material under test. This simple quadratic relationship also assumes that the internal magnetic moment $M_{int}$ in the test material tracks the external applied field $H_{ext}$ in phase, which it clearly cannot until well above saturation because of the various effects on internal moment $M_{int}$ from local coupling and magnetic anisotropy. The assumed magnetization curve linearity is valid only for an ideal uniaxial anisotropy sample with the external applied field $H_{ext}$ oriented along the hard axis of the sample. Real materials exhibit non-linear magnetization curves when the external applied field $H_{ext}$ is oriented along any other axis, as is well-known in the art. In the existing rotating field measurement method, the external applied field $H_{ext}$ is applied along all axes, giving many other non-quadratic measured magnetostrain terms which, until now, have been ignored in the art. A favored method for reducing the resulting measurement errors is to drastically increase the external applied field $H_{ext}$ to force $M_{int}$ well above saturation in the sample, but this is now increasingly problematic in modern SV designs because of increased noise from eddy current effects and increased laser signal distortion from the thermal convection air turbulence caused by the heating effects of the high field coil currents required.

These unresolved problems and deficiencies are clearly felt in the art and are solved by this invention in the manner described below.

SUMMARY OF THE INVENTION

This invention solves the accuracy problems by for the first time including the effects of the harmonic cantilever deflection amplitudes $\{A_m\}$ other than the deflection amplitude $A_2$ measured at the second rotation harmonic frequency $f_2$. For example, this may be accomplished by adding two additional lock-in amplifiers for detecting the respective deflection amplitudes $\{A_1, A_3\}$ at the first and third harmonics $\{f, f3\}$. Using an external field intensity $H_{ext}$ equal to the sample saturation moment $M_{sat}$ and assuming a 15 Oe sample anisotropy $H_k$ and coupling bias $H_p$, the saturation magnetostriction coefficient $\lambda_S$ measurement error may be reduced by 90% over the error from using only the second harmonic deflection amplitudes $A_2$. Even when the external field intensity $H_{ext}$ is boosted to twice the sample saturation value in attempting to overcome these anisotropy $H_k$ and coupling bias $H_p$ effects, the method of this invention may reduce measurement errors by 80%. Additional harmonic cantilever deflection amplitudes $\{A_m\}$ may provide additional accuracy in the measured saturation magnetostriction coefficient $\lambda_S$.

It is a purpose of this invention to improve accuracy of magnetostriction measurements at a predetermined external field intensity $H_{ext}$ by incorporating deflection measurements at additional rotation harmonic frequencies to correct for the effects of magnetic moment phase distortion in the material under test while retaining the advantages of lock-in amplifier signal detection.

In one aspect, the invention is a machine-implemented method for measuring the magnetostriction coefficient $\lambda$ of a sample material applied to a substrate element having two ends, one end being fixed and the other end free to be deflected, including the steps of (a) exposing the substrate element to an external rotating magnetic field having an intensity $H_{ext}$ and a rotation frequency f, (b) detecting the amplitude $A_m$ of the deflection of the free end at each of a plurality of frequencies $\{f_m\}$ each representing a harmonic of the magnetic field rotation frequency f, and (c) combining signals representing a plurality of the harmonic deflection amplitudes $\{A_m\}$ to determine the magnetostriction coefficient $\lambda$ of the sample material.

In a preferred embodiment, the invention is an apparatus for measuring the magnetostriction coefficient of a sample material applied to a substrate element having two ends, including means for fixing the substrate element at one end leaving the other end free to be deflected, means for creating an external rotating magnetic field having an intensity $H_{ext}$ at the fixed substrate element and a rotation frequency f, means for measuring the amplitude $A_m$ of the deflection of the free end at each of a plurality of frequencies $\{f_m\}$ each representing a harmonic of the rotation frequency f, and processor means for combining signals representing a plurality of the harmonic deflection amplitudes $\{A_m\}$ to determine the magnetostriction coefficient $\lambda$ of the sample material.

The foregoing, together with other objects, features and advantages of this invention, can be better appreciated with reference to the following specification, claims and the accompanying drawing.

BRIEF DESCRIPTION OF THE DRAWINGS

For a more complete understanding of this invention, reference is now made to the following detailed description of the embodiments as illustrated in the accompanying drawing, in which like reference designations represent like features throughout the several views and wherein.

DESCRIPTION OF THE PREFERRED EMBODIMENT

Figure 1:
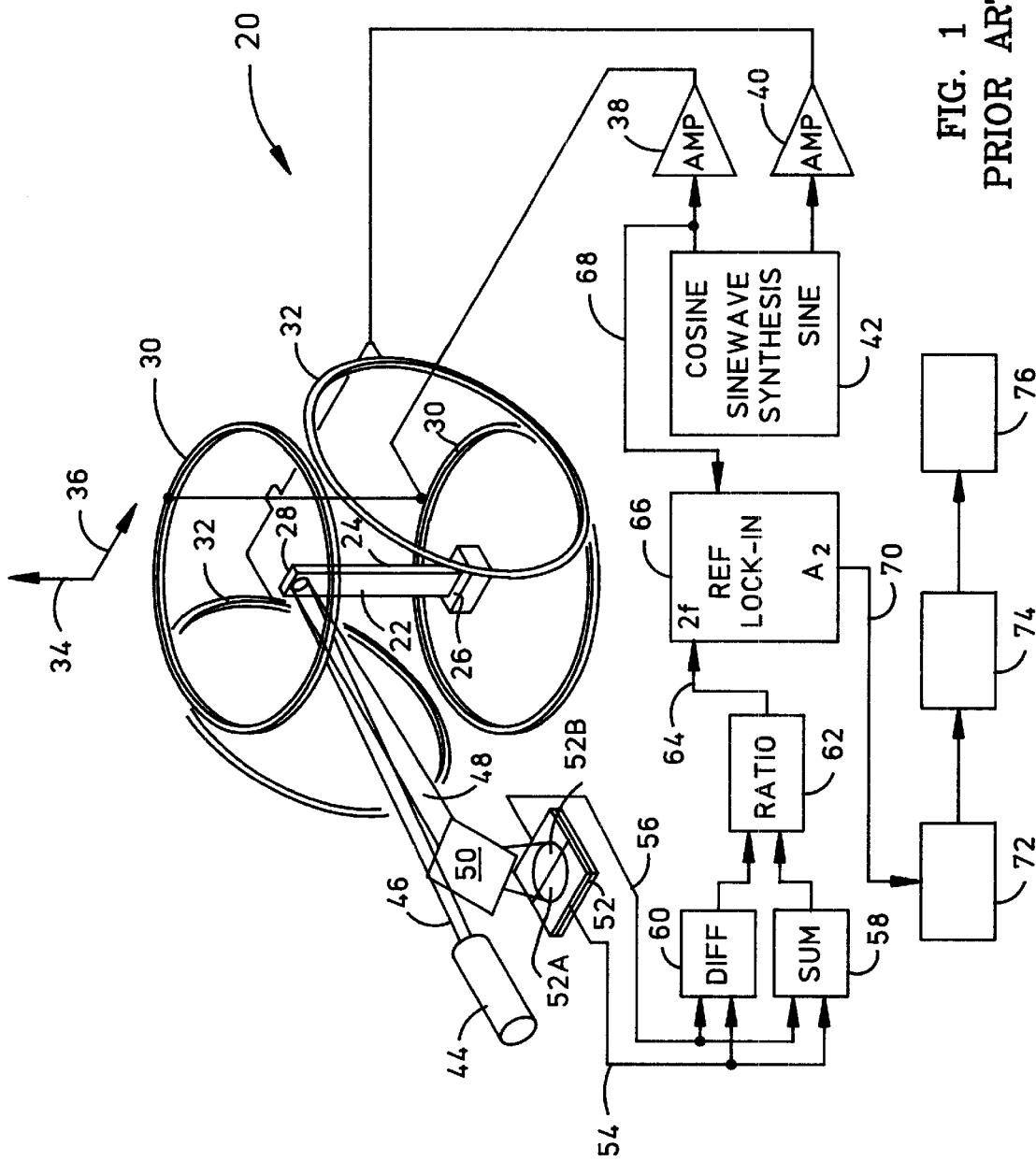
FIG. 1 is a functional block diagram illustrating an automated magnetostriction tester from the prior art.

FIG. 1 is a functional block diagram illustrating an automated magnetostriction tester known in the art and based on the sub-resonant rotating-field second-harmonic cantilever displacement amplitude technique discussed above with respect to the Tam et al. reference. The tester 20 includes a layer 22 of magnetic material under test applied to a substrate element 24 fixed at one end by means of a clamping assembly 26 with the other end 28 free to deflect. Two Helmholtz coil assemblies 30 and 32 are disposed orthogonally to provide a rotating external magnetic field vector in the plane of layer 22 on substrate element 24.

Practitioners in the art may readily appreciate that the first coil 30 generates a sinusoidal magnetic field vector along the first axis 34 of substrate element 24 and the second coil 32 generates a sinusoidal magnetic field vector along the second axis 36 of substrate element 24. When the current waveforms flowing in coils 30 and 32 are synchronized in quadrature (90° apart in phase), the sum of the two magnetic vectors may be represented as a rotating magnetic vector of constant intensity $H_{ext}$ in the plane of layer 22 on substrate element 24. The rotation frequency f is equal to the sinusoidal frequency of the two coil current waveforms, which are produced by the two current generators 38 and 40. The current waveform outputs from current generators 38 and 40 are regulated by the waveform controller 42, which controls both amplitude, frequency and phase of the waveform outputs from current generators 38 and 40.

A helium-neon laser 44 is disposed to produce and send an optical signal 46 to reflect off of free end 28. The reflected optical signal 48 is deflected by the mirror 50 to arrive at the segmented photosensor 52, which is precisely disposed so that any deflection of free end 28 is sensed as a change in the relative optical signal intensity at the two photosensor segments 52A and 52B. The two segment signals 54 and 56 from photosensor 52 are embodied as voltages, the relative values of which represent the deflection of free end 28 buried in noise. Segment signals 54 and 56 are summed in the preamplifier 58, subtracted in the preamplifier 60 and the sum and difference divided in the circuit 62 to produce a single scaled voltage signal 64 representing the deflection of free end 28, still buried in noise.

The lock-in amplifier 66 operates to detect and recover the 2f harmonic component of signal 64, where f is the rotation frequency of the magnetic field vector mentioned above, as represented by the reference signal 68 from waveform controller 42. As is well-known in the art, the sensitivity of lock-in amplifier 66 is necessary for the successful operation of tester 20 because the free end deflection amplitude $A_2$ signal 70 is too small to be otherwise recoverable. But only one frequency component may be recovered using a lock-in amplifier and recovered component must be a pre-determined harmonic of the reference signal.

The data store 72 and the processor 74 operate to store and convert deflection amplitude $A_2$ signal 70 into an estimate of the magnetostriction coefficient λ of the material in layer 22 and the output device 76 (a display, for example, or a printer) operates to provide a report of the measurements. The process from the mounting of substrate element 24 through the display of the measurement report may be entirely automatic.

Figure 2:
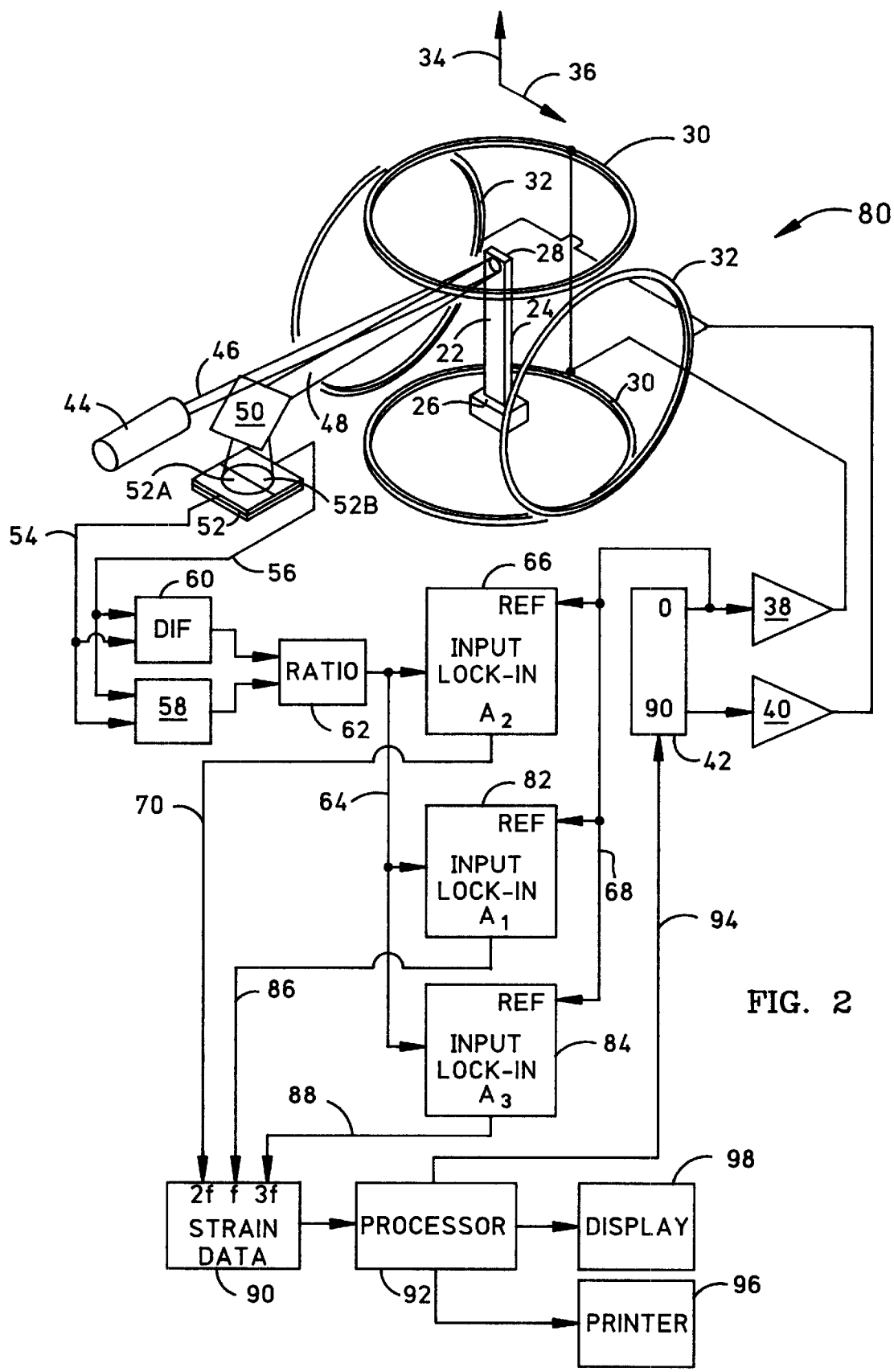
FIG. 2 is a functional block diagram illustrating an exemplary embodiment of the automated magnetostriction measurement apparatus of this invention.

FIG. 2 is a functional block diagram illustrating an exemplary embodiment 80 of the automated magnetostriction measurement apparatus of this invention. Many of the elements in apparatus 80 may be embodied using elements discussed above in connection with FIG. 1 and these like elements are shown with like numerals. For example, in apparatus 80, the coils 30 and 32 may be substantially identical in form and function with Helmholtz coils 30 and 32 in FIG. 1.

In FIG. 2, the single scaled voltage signal 64 recovered from circuit 62 is coupled to the input of the two additional lock-in amplifiers 82 and 84, as well as the lock-in amplifier 66. Moreover, the reference signal 68 produced by the waveform controller 42 is also coupled to the reference signal port of each lock-in amplifier 66, 82 and 84. Lock-in amplifier operation is well-known in the art and practitioners in the art may readily appreciate that each lock-in amplifier 66, 82 and 84 may be adapted to detect and recover from signal 64 any of the harmonics of reference signal 68. In FIG. 2, lock-in amplifier 66 recovers a signal 70 representing the deflection amplitude $A_2$ at the second harmonic of the magnetic field rotation frequency $f_2$, lock-in amplifier 82 recovers a signal 86 representing the deflection amplitude $A_1$ at the fundamental or first harmonic of the magnetic field rotation frequency $f_1=f$, and lock-in amplifier 84 recovers a signal 88 representing the deflection amplitude $A_3$ at the third harmonic of the magnetic field rotation frequency $f_3$.

The data store 90 accepts and stores the plurality of harmonic deflection amplitudes $\{A_2, A_1, A_3\}$ and the processor 92 combines the three values to obtain the magnetostriction coefficient λ measurement for the particular intensity $H_{ext}$ and frequency f of the external rotating magnetic field. These rotating field parameters $\{f, H_{ext}\}$ are controlled by waveform controller 42, which may be in turn controlled by processor 92 by means of signals on the bus 94. So, for example, following a measurement of the magnetostriction coefficient λ, the field intensity $H_{ext}$ may be adjusted under software control and the measurement repeated. This may be repeatedly done over a range of field intensities $\{H_{ext}\}$ to obtain a plurality of measured magnetostriction coefficients $\{\lambda\}$, which may be evaluated under software control to determine a measured saturation magnetostriction coefficient $\lambda_S$. These measurements may also be plotted as a graph by software means (not shown) in processor 92 and printed on a printer 96 and/or displayed on a display 98. This measurement and display process may be entirely automated.

Alternatively, within the scope of the method of this invention, signal 86 from lock-in amplifier 82 may be ignored without a major loss of accuracy. Signal 86 represents the deflection amplitude $A_1$ at the magnetic field rotation frequency and may be subject to error arising from interference by the fundamental fields of coils 30 and 32. Moreover, the deflection amplitude $A_1$ is not believed to contribute much accuracy of these measurements additional to that provided by the deflection amplitude $A_3$ represented by signal 88 from lock-in amplifier 84. Further, within the scope of the method of this invention, lock-in amplifier 82 may be adapted to select the fourth deflection amplitude harmonic $A_4$ (not shown) instead of the deflection amplitude $A_1$ and processor 92 may be adapted to produce a measured saturation magnetostriction coefficient $\lambda_S$ value corresponding to the three deflection amplitudes $\{A_2, A_3, A_4\}$.

Figure 3:
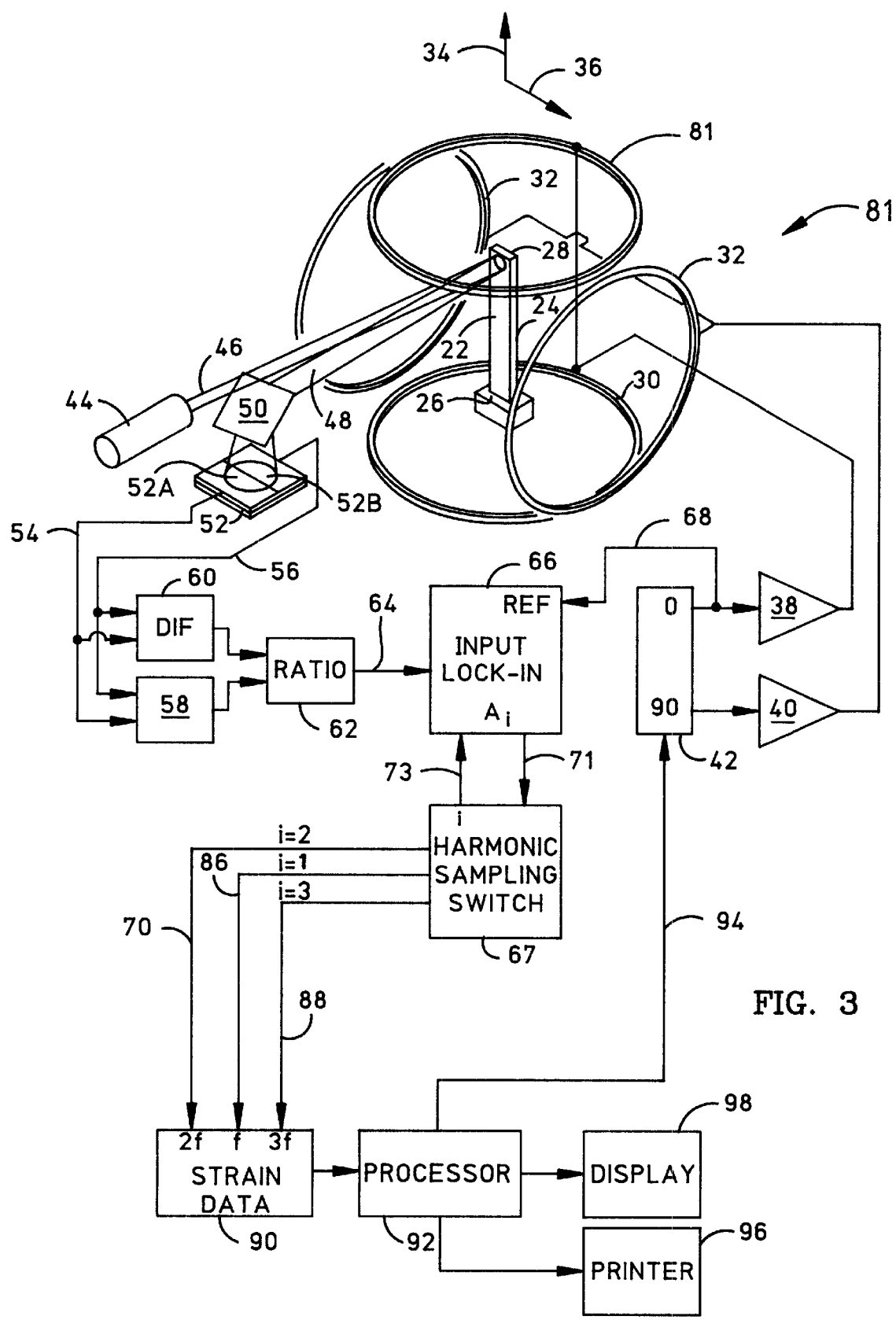
FIG. 3 is a functional block diagram illustrating an alternative embodiment of the automated magnetostriction measurement apparatus of this invention.

FIG. 3 is a functional block diagram illustrating an alternative embodiment 81 of the automated magnetostriction measurement apparatus of this invention. Many of the elements in apparatus 81 may be embodied using elements discussed above in connection with FIGS. 1–2 and these like elements are shown with like numerals. For example, in apparatus 81, the coils 30 and 32 may be substantially identical in form and function with Helmholtz coils 30 and 32 in FIGS. 1–2.

In FIG. 3, the single scaled voltage signal 64 recovered from circuit 62 is coupled to the input of the single lock-in amplifier 66. Moreover, the reference signal 68 produced by the waveform controller 42 is coupled to the reference signal port of lock-in amplifier 66. The harmonic sampling switch 67 is coupled to (or included within) lock-in amplifier 66 to select the $i^{th}$ deflection amplitude harmonic $A_i$ (i=1, 2, 3, . . . ) on the line 71 by means of a harmonic select signal 73. Harmonic sampling switch 67 includes any useful means known in the art for time-sharing the operation of lock-in amplifier 66 among a plurality of deflection amplitude harmonics $\{A_i\}$, for example, the plurality of harmonic deflection amplitudes $\{A_2, A_1, A_3\}$ represented by signals 86, 70 and 88, respectively. In FIG. 3 the combination of lock-in amplifier 66 and harmonic sampling switch 67 operates to recover a signal 70 representing the deflection amplitude $A_2$ at the second harmonic of the magnetic field rotation frequency $f_2$ for a brief interval before switching to recover a signal 86 representing the deflection amplitude $A_1$ at the fundamental or first harmonic of the magnetic field rotation frequency $f_1=f$ for a brief interval, before switching to recover a signal 88 representing the deflection amplitude $A_3$ at the third harmonic of the magnetic field rotation frequency $f_3$ and so forth.

The data store 90 accepts and stores the plurality of harmonic deflection amplitudes $\{A_2, A_1, A_3\}$ and the processor 92 combines the three values to obtain the magnetostriction coefficient λ measurement for the particular intensity H$ext$ and frequency f of the external rotating magnetic field. These rotating field parameters $\{f, H_{ext}\}$ are controlled by waveform controller 42, which may be in turn controlled by processor 92 by means of signals on the bus 94. So, for example, following a measurement of the magnetostriction coefficient λ, the field intensity $H_{ext}$ may be adjusted under software control and the measurement repeated. This may be repeatedly done over a range of field intensities $\{H_{ext}\}$ to obtain a plurality of measured magnetostriction coefficients $\{\lambda\}$, which may be evaluated under software control to determine a measured saturation magnetostriction coefficient $\lambda_S$. These measurements may also be plotted as a graph by software means (not shown) in processor 92 and printed on a printer 96 and/or displayed on a display 98. This measurement and display process may be entirely automated. When the time-sharing interval is long with respect to the field rotation frequency, apparatus 81 (FIG. 3) should yield measurements as accurate as those available from apparatus 80 (FIG. 2).

Alternatively, according to the method of this invention, the combination of harmonic sampling switch 67 and lock-in amplifier 66 may be adapted to select the fourth deflection amplitude harmonic $A_4$ (not shown) instead of the deflection amplitude fundamental $A_1$ and processor 92 may be adapted to produce a measured saturation magnetostriction coefficient $\lambda_S$ value corresponding to the three deflection amplitudes $\{A_2, A_3, A_4\}$.

Figure 4:
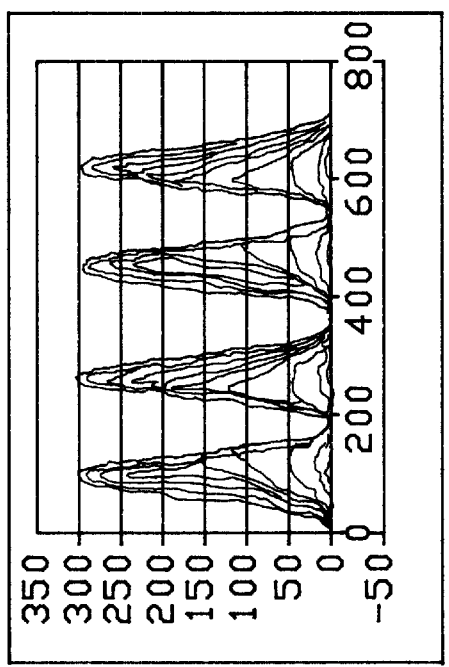
FIG. 4 is a chart illustrating the theoretical variation of the sample internal magnetic moment $M_{int}$ versus time in an external rotating magnetic field of intensity $H_{ext}$ with sample anisotropy $H_k=0$ and sample coupling bias $H_p=0$.
Figure 5:
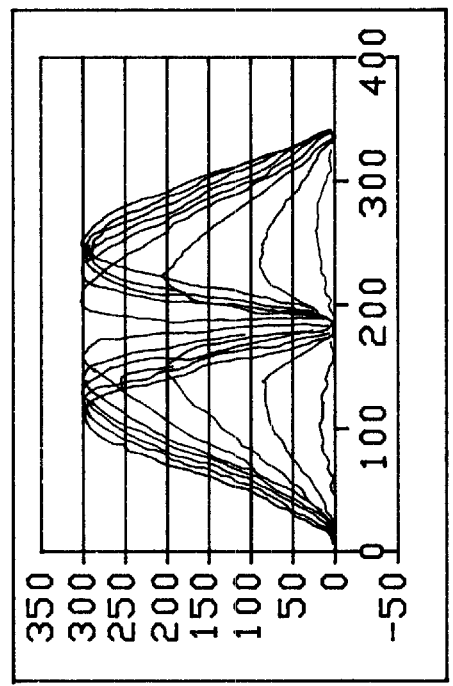
FIG. 5 is a chart illustrating the theoretical variation of the sample internal magnetic moment $M_{int}$ versus time in an external rotating magnetic field of several intensities $\{H_{ext}\}$ with sample anisotropy $H_k=10$ Oe and sample coupling bias $H_p=5$ Oe.
Figure 6:
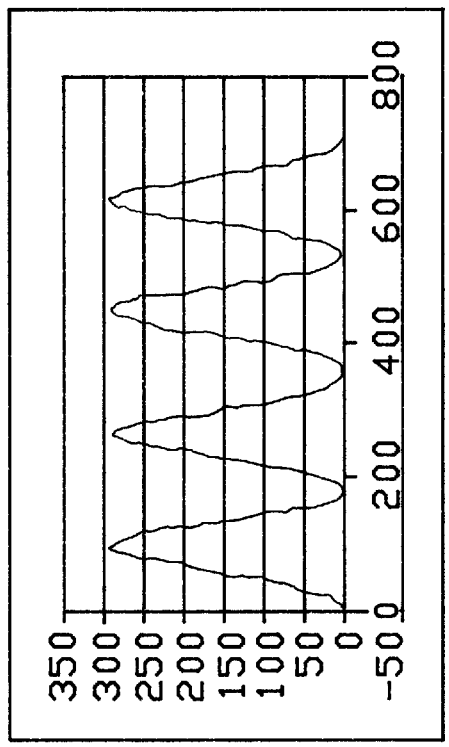
FIG. 6 is a chart illustrating the theoretical variation of the sample internal magnetic moment $M_{int}$ versus time in an external rotating magnetic field of several intensities $\{H_{ext}\}$ with sample anisotropy $H_k=15$ Oe and-sample coupling bias $H_p=0$.
Figure 7:
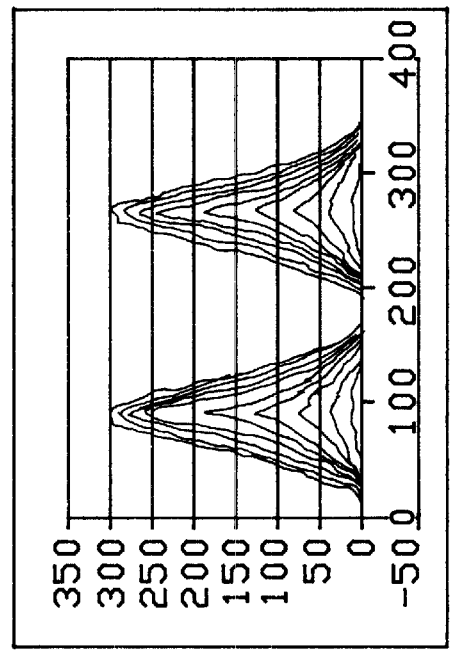
FIG. 7 is a chart illustrating the theoretical variation of the sample internal magnetic moment $M_{int}$ versus time in an external rotating magnetic field of several intensities $\{H_{ext}\}$ with sample anisotropy $H_k=15$ and sample coupling bias $H_p=15$ Oe.

FIG. 4 shows a theoretical variation of internal magnetic moment $M_{int}$ versus time in an external rotating magnetic field of intensity $H_{ext}$ for a sample having anisotropy $H_k=0$ and coupling bias $H_p=0$. This is the relationship assumed in the prior art. But this ideal relationship does not reflect reality, which includes finite values for anisotropy $H_k$ and pinning fields $H_p$. More realistically, FIG. 5 shows a theoretical variation of internal magnetic moment $M_{int}$ versus time in several different external rotating magnetic field intensities $\{H_{ext}\}$ for a sample having anisotropy $H_k=10$ Oe and coupling bias $H_p=5$ Oe. Note that the internal moment $M_{int}$ phase is delayed substantially at lower applied field intensities $\{H_{ext} \leq M_{sat}\}$ and approaches the applied field $H_{ext}$ phase only at very high values $\{H_{ext} >> M_{sat}\}$ Similarly, FIG. 6 shows a theoretical variation of internal magnetic moment $M_{int}$ versus time (expanded scale) in several different external rotating magnetic field intensities $\{H_{ext}\}$ for a sample having anisotropy $H_k=15$ Oe and sample coupling bias $H_p=0$. FIG. 7 shows the same thing for a sample having anisotropy $H_k=15$ and sample coupling bias $H_p=15$ Oe. The phase distortion is severe even at high intensities $\{H_{ext}\}$. Of course, very high external field intensities $\{H_{ext}\}$ may eventually reduce this phase distortion but are very disadvantageous because of heating and other effects. These examples demonstrate the need for the system of this invention and the following theoretical examples demonstrate the advantages thereof.

Figure 8:
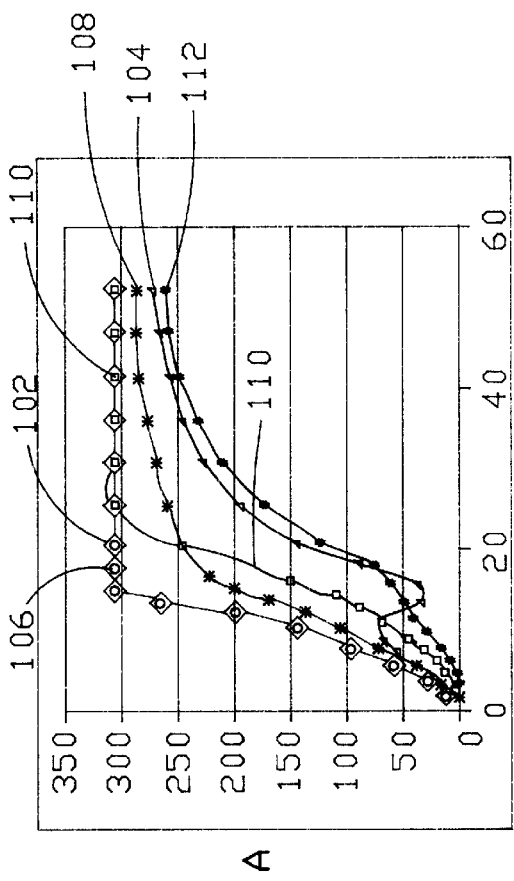
FIG. 8 is a chart comparing the theoretical values of the deflection amplitude A from actual magnetostrictive strain and the deflection amplitude $A_2$ at the second field rotation harmonic frequency $f_2$ versus an external magnetic field $H_{ext}$ rotating at frequency f for selected combinations of sample anisotropy $H_k$ and coupling bias $H_p$ values.

The line 102 in FIG. 8 shows the theoretical deflection amplitude A from actual magnetostrictive strain versus external magnetic field $H_{ext}$ rotating at frequency f for anisotropy $H_k=0$ and coupling bias $H_p=15$ Oe. The line 104 shows the theoretical deflection amplitude $A_2$ at the second field rotation harmonic frequency $f_2$ for the same parameters. The line 106 shows the theoretical deflection amplitude A and the line 108 shows the theoretical deflection amplitude $A_2$ for anisotropy $H_k=15$ Oe and coupling bias $H_p=0$. The line 110 in FIG. 8 (and in FIGS. 9–10) shows the theoretical deflection amplitude A and the line 112 (also in FIGS. 9–10) shows the theoretical deflection amplitude $A_2$ for anisotropy $H_k=15$ Oe and coupling bias $H_p=15$ Oe. Because the displacement amplitude is presumed to be proportional to the magnetostriction coefficient λ, the differences between line pairs 102–104, 106-108 and 110–112 demonstrate the measurement errors resulting from any reliance of the 2f harmonic alone to determine the magnetostriction coefficient λ.

Figure 10:
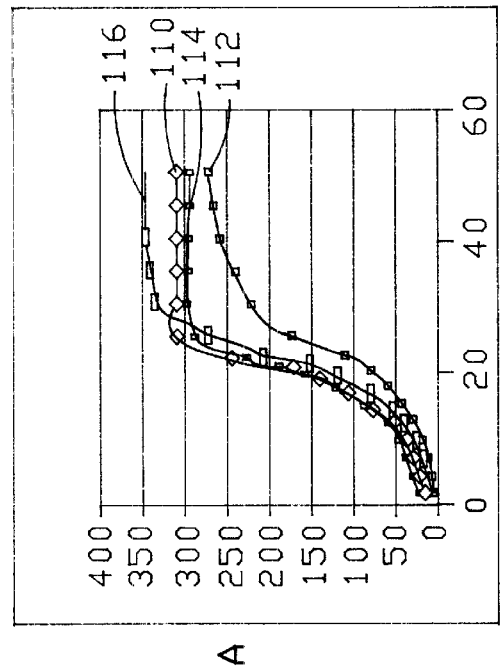
FIG. 10 is a chart comparing the theoretical values of the deflection amplitude A from actual magnetostrictive strain and selected combinations of the three deflection amplitudes $\{A_1, A_2, A_3\}$ at the three respective first, second and third field rotation harmonic frequencies $\{f, f_2, f_3\}$ versus an external rotating magnetic field $H_{ext}$ with sample anisotropy $H_k=15$ and sample coupling bias $H_p=15$ Oe.
Figure 9:
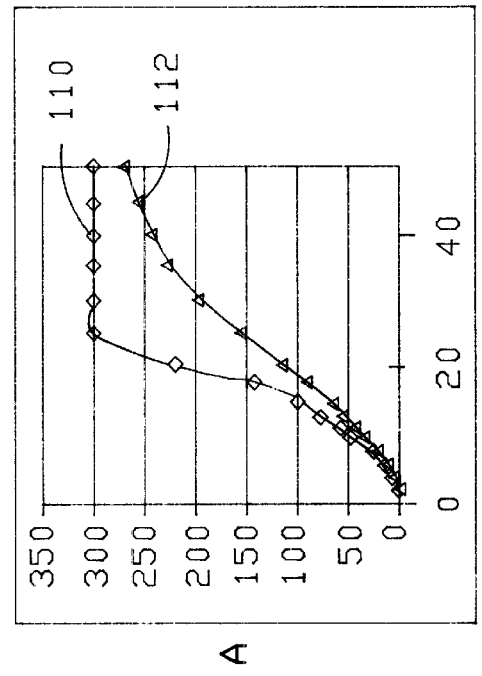
FIG. 9 is a chart comparing the theoretical values of the deflection amplitude A from actual magnetostrictive strain and the deflection amplitude $A_2$ at the second field rotation harmonic frequency $f_2$ versus an external magnetic field $H_{ext}$ rotating at frequency f with sample anisotropy $H_k=15$ Oe and sample coupling bias $H_p=15$ Oe.

FIG. 9 summarizes the errors present in the method discussed above in connection with FIG. 1 for typical 15 Oe values of anisotropy $H_k$ and coupling bias $H_p$. The same lines 110–112 are also shown in FIG. 10, which demonstrates the effects of the method of this invention. The line 114 in FIG. 10 shows the theoretical value of the combination of the three deflection amplitudes $\{A_1, A_2, A_3\}$ measured at the three respective first, second and third field rotation harmonic frequencies $\{f, f_2, f_3\}$ for a sample having anisotropy $H_k=15$ and coupling bias $H_p=15$ Oe. The accuracy is substantially improved with the error shown as reduced by nearly 90% at saturation. The line 116 shows the theoretical value of the combination of the two deflection amplitudes $\{A_2, A_3\}$, thereby showing the effect of omitting the fundamental component from line 114. By adding only the third harmonic amplitude $A_3$ the to second harmonic amplitude $A_2$ commonly used in the art, the accuracy is improved with error reduced by nearly 80% at saturation.

Alternatively, the effects of the sample coupling bias $H_p$ may be nulled by passing a DC current through coils 30 and 32, measuring coupling bias $H_p$ by adjusting the DC current magnitude to minimize the second rotation frequency harmonic component $A_2$, and subtracting the resulting coupling bias $H_p$ from the magnetostriction coefficient measurements. Because this strategy improves the accuracy of the second harmonic magnetostriction coefficient measurements, it may be advantageously employed to improve the accuracy of the multiple harmonic method of this invention.

Referring again to FIG. 2, the substrate 24 may be a strip of nonmagnetic material, such as glass, which is fixed to deflect toward and away from the laser 44 in response to the rotating magnetic field acting on the magnetic layer 22. The top end of the magnetic layer 22 is reflective to a laser beam or is provided with a material or a mirror that is reflective to a laser beam.

Clearly, other embodiments and modifications of this invention may occur readily to those of ordinary skill in the art in view of these teachings. Therefore, this invention is to be limited only by the following claims, which include all such embodiments and modifications when viewed in conjunction with the above specification and accompanying drawing.

We claim:

1. A method for measuring the magnetostriction coefficient λ of a sample material applied to a substrate element having two ends, one end being fixed and the other end being free to be deflected, the method comprising the unordered steps of:

(a) exposing the substrate element to an external rotating magnetic field having an intensity $H_{ext}$ and a rotation frequency f;

(b) detecting the amplitude $A_m$ of a deflection of the free end at each of a plurality of frequencies $\{f_m\}$ wherein each frequency $f_m$ represents a harmonic of the magnetic field rotation frequency f; and (c) combining signals representing a plurality of detected harmonic deflection amplitudes $\{A_m\}$ to determine the magnetostriction coefficient λ of the sample material.

2. The method of claim 1 further comprising the unordered steps of:
(d) changing the external rotating magnetic field intensity $H_{ext}$ and repeating the detecting step (b) and the combining step (c) to determine the magnetostriction coefficient λ of the sample material; and
(e) combining signals representing a plurality of measured magnetostriction coefficients {λ} to determine the saturation magnetostriction coefficient $λ_S$ of the sample material.

3. The method of claim 2 wherein the plurality of harmonic deflection amplitudes $\{A_m\}$ includes the three respective deflection amplitudes $\{A_1, A_2, A_3\}$ at the first, second and third harmonics $\{f, f_2, f_3\}$ of the magnetic field rotation frequency f.

4. The method of claim 3 wherein the fixed substrate element has a mechanical resonant frequency $f_0$ that is substantially greater than the magnetic field rotation frequency f.

5. The method of claim 4 wherein the mechanical resonant frequency $f_0$ is greater than any of the plurality of harmonic frequencies $\{f_m\}$.

6. The method of claim 2 wherein the fixed substrate element has a mechanical resonant frequency $f_0$ that is greater than any of the plurality of harmonic frequencies $\{f_m\}$.

7. The method of claim 2 wherein the plurality of harmonic deflection amplitudes $\{A_m\}$ includes the three respective deflection amplitudes $\{A_2, A_3, A_4\}$ at the second, third and fourth harmonics $\{f_2, f_3, f_4\}$ of the magnetic field rotation frequency f.

8. The method of claim 1 wherein the fixed substrate element has a mechanical resonant frequency $f_0$ that is substantially greater than the magnetic field rotation frequency f.

9. The method of claim 7 wherein the mechanical resonant frequency $f_0$ is greater than any of the plurality of harmonic frequencies $\{f_m\}$.

10. The method of claim 1 wherein the fixed substrate element has a mechanical resonant frequency $f_0$ that is greater than any of the plurality of harmonic frequencies $\{f_m\}$.

11. The method of claim 1 wherein the plurality of harmonic deflection amplitudes $\{A_m\}$ includes the three respective deflection amplitudes $\{A_1, A_2, A_3\}$ at the first, second and third harmonics $\{f, f_2, f_3\}$ of the magnetic field rotation frequency f.

12. The method of claim 2 wherein the plurality of harmonic deflection amplitudes $\{A_m\}$ includes the three respective deflection amplitudes $\{A_2, A_3, A_4\}$ at the second, third and fourth harmonics $\{f_2, f_3, f_4\}$ of the magnetic field rotation frequency f.

13. An apparatus for measuring the magnetostriction coefficient of a sample material applied to a substrate element having two ends, the apparatus comprising:
means for fixing the substrate element at one end leaving the other end free to be deflected;
means for creating an external rotating magnetic field having an intensity $H_{ext}$ at the fixed substrate element and a rotation frequency f;
means for measuring the amplitude $A_m$ of the deflection of the free end at each of a plurality of frequencies $\{f_m\}$ each representing a harmonic of the rotation frequency f; and
means for combining signals representing a plurality of the harmonic deflection amplitudes $\{A_m\}$ to determine the magnetostriction coefficient λ of the sample material.

14. The apparatus of claim 13 further comprising:
first and second coils disposed about the fixed substrate element;
first and second current generators having output waveforms coupled respectively to the first and second coils; and
a waveform controller coupled to the first and second current generators for regulating the phase of the first generator output waveform with respect to the second generator output waveform.

15. The apparatus of claim 14 further comprising:
a laser disposed for generating an optical signal to illuminate the free end of the substrate element;
a sensor disposed for receiving the optical signal reflected from the free end of the substrate element; and
a plurality of lock-in amplifiers coupled to the sensor for recovering the plurality of harmonic deflection amplitudes $\{A_m\}$ from the received optical signal.

16. The apparatus of claim 15 further comprising:
an amplitude controller coupled to the first and second current generators for regulating the output waveform amplitudes, thereby regulating the external rotating magnetic field intensity $H_{ext}$.

17. The apparatus of claim 16 wherein the plurality of lock-in amplifiers includes three lock-in amplifiers respectively disposed to recover the three respective deflection amplitudes $\{A_1, A_2, A_3\}$ at the first, second and third harmonics $\{f, f_2, f_3\}$ of the magnetic field rotation frequency f.

18. The apparatus of claim 17 further comprising:
display means coupled to the processor means for producing a report of the magnetostriction coefficient measurements.

19. The apparatus of claim 16 wherein the plurality of lock-in amplifiers includes three lock-in amplifiers respectively disposed to recover the three respective deflection amplitudes $\{A_2, A_3, A_4\}$ at the second, third and fourth harmonics $\{f_2, f_3, f_4\}$ of the magnetic field rotation frequency f.

20. The apparatus of claim 14 further comprising:
a laser disposed for generating an optical signal to illuminate the free end of the substrate element;
a sensor disposed for receiving the optical signal reflected from the free end of the substrate element;
a lock-in amplifier coupled to the sensor for recovering the $i^{th}$ harmonic deflection amplitude $A_i$ from the received optical signal, wherein i is a positive integer; and
a harmonic sampling switch coupled to the lock-in amplifier for sampling the $i^{th}$ harmonic deflection amplitude $A_i$ to recover the plurality of harmonic deflection amplitudes $\{A_m\}$.

21. The apparatus of claim 20 wherein the harmonic sampling switch is disposed to recover the three respective deflection amplitudes $\{A_1, A_2, A_3\}$ at the first, second and third harmonics $\{f, f_2, f_3\}$ of the magnetic field rotation frequency f.

22. The apparatus of claim 20 wherein the harmonic sampling switch is disposed to recover the three respective deflection amplitudes $\{A_2, A_3, A_4\}$ at the second, third and fourth harmonics $\{f_2, f_3, f_4\}$ of the magnetic field rotation frequency f.

23. The apparatus of claim 14 further comprising:
an amplitude controller coupled to the first and second current generators for regulating the output waveform amplitudes, thereby regulating the external rotating magnetic field intensity $H_{ext}$.

24. The apparatus of claim 13 further comprising:

display means coupled to the processor means for producing a report of the magnetostriction coefficient measurements.

25. The apparatus of claim 13 further comprising:

a laser disposed for generating an optical signal to illuminate the free end of the substrate element;

a sensor disposed for receiving the optical signal reflected from the free end of the substrate element; and a plurality of lock-in amplifiers coupled to the sensor for recovering the plurality of harmonic deflection amplitudes $\{A_m\}$ from the received optical signal.

26. The apparatus of claim 13 further comprising:

a laser disposed for generating an optical signal to illuminate the free end of the substrate element;

a sensor disposed for receiving the optical signal reflected from the free end of the substrate element;

a lock-in amplifier coupled to the sensor for recovering the $i^{th}$ harmonic deflection amplitude $A_i$ from the received optical signal, wherein i is a positive integer; and a harmonic sampling switch coupled to the lock-in amplifier for sampling the $i^{th}$ harmonic deflection amplitude $A_i$ to recover the plurality of harmonic deflection amplitudes $\{A_m\}$.

* * * * *